United States Patent
Newcomb et al.

(10) Patent No.: US 12,446,374 B2
(45) Date of Patent: Oct. 14, 2025

(54) TRANSPARENT STRUCTURAL COMPOSITES WITH ENCAPSULATED MICRO-LEDS

(71) Applicant: GM GLOBAL TECHNOLOGY OPERATIONS LLC, Detroit, MI (US)

(72) Inventors: Bradley Allen Newcomb, Troy, MI (US); Julien P. Mourou, Bloomfield Hills, MI (US); Thomas S. Prevost, West Bloomfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 744 days.

(21) Appl. No.: 17/699,696

(22) Filed: Mar. 21, 2022

(65) Prior Publication Data

US 2023/0299245 A1  Sep. 21, 2023

(51) Int. Cl.
*H10H 20/01* (2025.01)
*H01L 25/075* (2006.01)
*H10H 20/854* (2025.01)
*H10H 20/857* (2025.01)

(52) U.S. Cl.
CPC ....... *H10H 20/854* (2025.01); *H01L 25/0753* (2013.01); *H10H 20/857* (2025.01); *H10H 20/0362* (2025.01)

(58) Field of Classification Search
CPC ... H10H 20/00–882; H10H 29/00–142; H10H 29/30–962; F21K 9/00–278; H01L 25/0753; B60J 1/00; B60Q 3/00; B60Q 3/208
See application file for complete search history.

(56) References Cited

U.S. PATENT DOCUMENTS

| | | | |
|---|---|---|---|
| 7,144,830 B2 | 12/2006 | Hill et al. | |
| 11,731,570 B2 | 8/2023 | Newcomb et al. | |
| 12,049,257 B2 | 7/2024 | Newcomb et al. | |
| 2005/0106370 A1* | 5/2005 | Takai | C23C 18/31 428/209 |
| 2019/0348588 A1* | 11/2019 | Hsieh | H10H 20/857 |
| 2021/0043616 A1* | 2/2021 | Jung | H10H 20/01 |
| 2021/0155293 A1 | 5/2021 | Aitharaju et al. | |
| 2023/0137752 A1* | 5/2023 | Wang | H10H 20/857 257/88 |
| 2023/0207743 A1* | 6/2023 | Lee | H10H 20/8506 257/91 |

(Continued)

FOREIGN PATENT DOCUMENTS

| | | |
|---|---|---|
| ES | 2538738 B1 | 4/2016 |
| WO | WO-2008152575 A1 | 12/2008 |

OTHER PUBLICATIONS

U.S. Appl. No. 17/141,478, filed Jan. 5, 2021, Newcomb et al.

(Continued)

*Primary Examiner* — Moin M Rahman

(57) ABSTRACT

A transparent structural component including embedded light emitting diodes (LEDs) includes a transparent layer. A plurality of LEDs is arranged on the transparent layer. A plurality of interconnections is made to the plurality of LEDs. A plurality of structural fibers arranged adjacent to the transparent layer. A transparent material encapsulates the transparent layer, the plurality of LEDs, the plurality of interconnections and the plurality of structural fibers.

20 Claims, 8 Drawing Sheets

(56) References Cited

U.S. PATENT DOCUMENTS

2023/0282676 A1* 9/2023 Yang ................. H01L 25/167
                         438/106

OTHER PUBLICATIONS

U.S. Appl. No. 17/141,524, filed Jan. 5, 2021, Newcomb et al.
U.S. Appl. No. 17/146,774, filed Jan. 12, 2021, Newcomb et al.
U.S. Appl. No. 17/152,965, filed Jan. 20, 2021, Newcomb et al.
U.S. Appl. No. 17/226,232, filed Apr. 9, 2021, Newcomb et al.
Lee, Ho-Jun et al. "Improved Light Output Power of Chemically Transferred InGaN/GaN Light-Emitting Diodes for Flexible Optoelectronic Applications". Journal of Nanomaterials; Hindawai Publishing Corporation; vol. 2015, Article ID 142096, 6 pages; http://dx.doi.org/10.1155/2015/142096.
German Office Action from counterpart DE1020221266850, dated May 12, 2025.

* cited by examiner

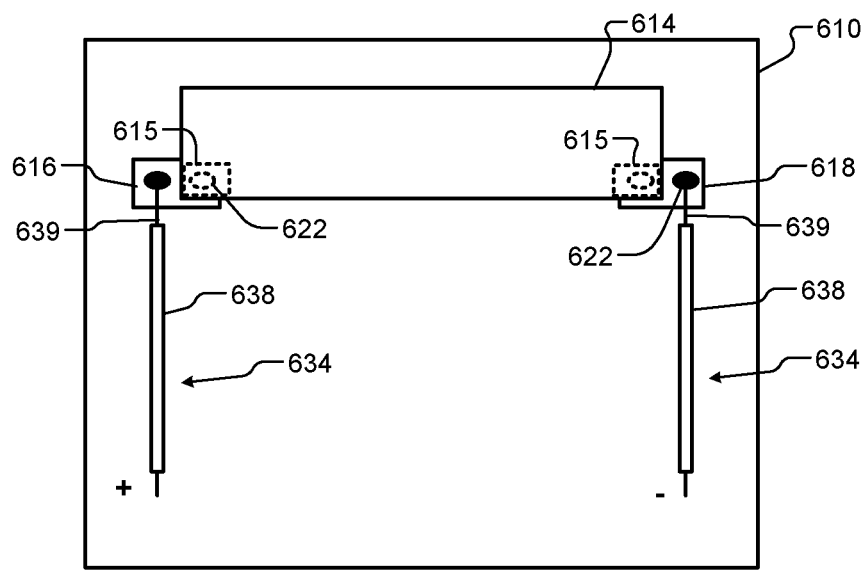
FIG. 8
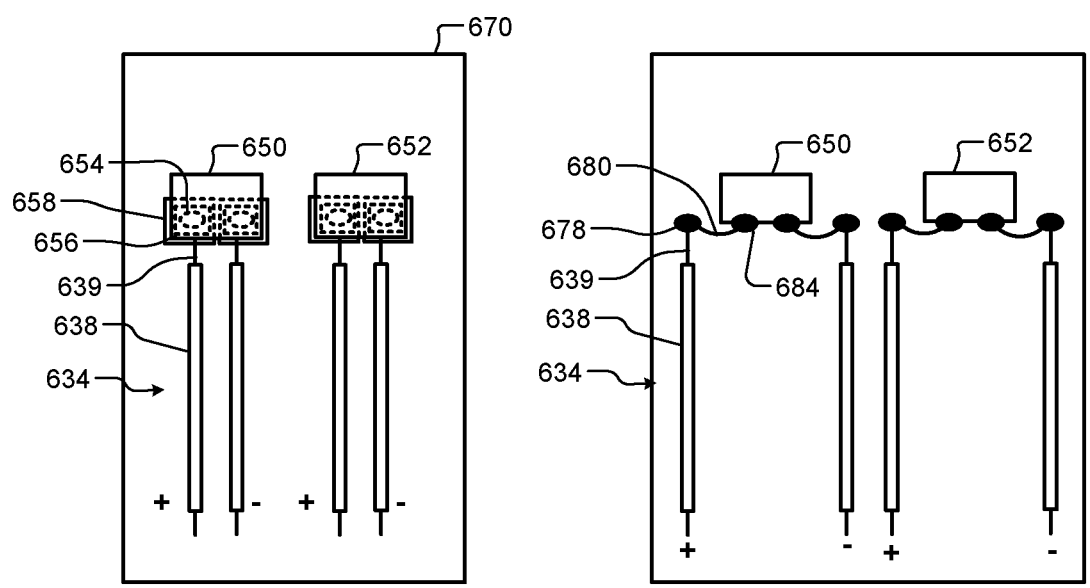
FIG. 9
FIG. 10

TRANSPARENT STRUCTURAL COMPOSITES WITH ENCAPSULATED MICRO-LEDS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to transparent structural composites and more particularly to transparent structural composites with encapsulated LEDs or micro-LEDs.

Vehicles such as automobiles include a frame and a passenger compartment located inside of the frame. The vehicle may include A-pillars, B-pillars, C-pillars and/or D-pillars extending between the vehicle frame and a roof structure. A windshield is mounted between the A-pillars of the vehicle body to allow a driver to view the roadway. Driver-side and passenger-side door assemblies are pivotably mounted to sides of the vehicle between the A and B-pillars (for coupes) and/or B and C pillars (for sedans) to provide access to the passenger compartment and enable lateral visibility via windows.

A rear window is mounted between the C-pillars (for three-box body designs) or D-pillars (for two-box body designs) to provide rearward visibility. To provide extra sunlight and/or ventilation, the roof structure may include a transparent roof, a moonroof or a sunroof supported between roof rails of the roof structure.

SUMMARY

A transparent structural component including embedded light emitting diodes (LEDs) includes a transparent layer. A plurality of LEDs is arranged on the transparent layer. A plurality of interconnections is made to the plurality of LEDs. A plurality of structural fibers arranged adjacent to the transparent layer. A transparent material encapsulates the transparent layer, the plurality of LEDs, the plurality of interconnections and the plurality of structural fibers.

In other features, the plurality of structural fibers are selected from a group consisting of glass fibers, carbon fibers, basalt fibers, aramid fibers, polyethylene fibers, polypropylene fibers, natural fibers, and combinations thereof.

In other features, at least one of the transparent layer and the transparent material are selected from a group consisting of polyethylenimine (PEI), polyamide-imide (PAI), polyamide (PA), polyetheretherketone (PEEK), polyetherketone (PEK), a polyphenylene sulfide (PPS), a thermoplastic polyurethane (TPU), polypropylene (PP), polycarbonate/acrylonitrile butadiene styrene (PC/ABS), high-density polyethylene (HDPE), polyethylene terephthalate (PET), poly(methyl methacrylate) (PMMA), polycarbonate (PC), polyaryletherketone (PAEK), polyetherketoneketone (PEKK), co-transparent layers thereof, and combinations thereof.

In other features, the plurality of interconnections to the plurality of LEDs are selected from a group consisting of copper traces formed on the transparent layer, first conductive ink traces, and conductive fibers.

In other features, the plurality of interconnections to the plurality of LEDs comprise conductive fibers. A plurality of portions of the first conductive ink traces is covered by a dielectric ink. Second conductive ink traces are arranged over the dielectric ink and the first conductive ink traces at the plurality of portions. Conductive fibers are selected from a group consisting of conductive carbon fibers, metal-coated fibers and non-conductive fibers wound around a conductive wire.

In other features, the transparent layer has a first index of refraction and the transparent material is made of a second material having a second index of refraction, and wherein a difference between the first index of refraction and the second index of refraction is less than 2.5% of the first index of refraction. A difference between the first index of refraction and the second index of refraction is less than 1% of the first index of refraction.

In other features, the transparent layer and the transparent material are made of the same type of material. The plurality of LEDs comprise microLEDs.

A method for making a transparent structural component including embedded light emitting diodes (LEDs) includes providing a transparent layer and a plurality of LEDs arranged on the transparent layer; providing a plurality of interconnections to the plurality of LEDs; arranging a plurality of structural fibers adjacent to the transparent layer; and encapsulating the transparent layer, the plurality of LEDs, the plurality of interconnections and the plurality of structural fibers in a transparent material.

In other features, the method includes selecting the plurality of structural fibers from a group consisting of glass fibers, carbon fibers, basalt fibers, aramid fibers, polyethylene fibers, polypropylene fibers, natural fibers, and combinations thereof.

In other features, the method includes selecting at least one of the transparent layer and the transparent material from a group consisting of polyethylenimine (PEI), polyamide-imide (PAI), polyamide (PA), polyetheretherketone (PEEK), polyetherketone (PEK), a polyphenylene sulfide (PPS), a thermoplastic polyurethane (TPU), polypropylene (PP), polycarbonate/acrylonitrile butadiene styrene (PC/ABS), high-density polyethylene (HDPE), polyethylene terephthalate (PET), poly(methyl methacrylate) (PMMA), polycarbonate (PC), polyaryletherketone (PAEK), polyetherketoneketone (PEKK), co-transparent layers thereof, and combinations thereof.

In other features, the plurality of interconnections to the plurality of LEDs are selected from a group consisting of copper traces formed on the transparent layer, first conductive ink traces printed on the transparent layer, and conductive fibers attached to the plurality of LEDs.

In other features, the plurality of interconnections to the plurality of LEDs comprise conductive fibers, a plurality of portions of the first conductive ink traces are covered by a dielectric ink, and second conductive ink traces are arranged over the dielectric ink and the first conductive ink traces at the plurality of portions.

In other features, the plurality of interconnections to the plurality of LEDs comprise conductive fibers and the method includes selecting the conductive fibers from a group consisting of conductive carbon fibers, metal-coated fibers and non-conductive fibers wound around a conductive wire.

In other features, the transparent layer has a first index of refraction and the transparent material is made of a second material having a second index of refraction. A difference between the first index of refraction and the second index of refraction is less than 2.5% of the first index of refraction. A difference between the first index of refraction and the second index of refraction is less than 1% of the first index of refraction. The transparent layer and the transparent material are made of the same type of material. The plurality of LEDs comprise microLEDs.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 8-10 illustrate various examples of conductive fibers interconnecting the LEDs or microLEDs according to the present disclosure.

In the drawings, reference numbers may be reused to identify similar and/or identical elements.

DETAILED DESCRIPTION

The present disclosure relates to a transparent structural component for a vehicle. The transparent structural component includes structural fibers and a plurality of LEDs or microLEDs that are encapsulated in a transparent material. The LEDs or microLEDs of the transparent structural component provide a display, task lighting and/or lighting as a design element. While the foregoing description relates to microLEDs, either LEDs or microLEDs can be used.

The plurality of microLEDs are initially manufactured on a transparent layer. The microLEDs are interconnected by conductive traces, conductive ink, and/or conductive fibers to allow power and/or ground to be supplied either individually to each microLED and/or collectively to groups of microLEDs that are operated at the same time. After interconnection, structural fibers are laid over the transparent layer. The transparent layer, the plurality of microLEDs, the interconnects and the structural fibers are over-molded (or encapsulated) in a transparent material to form the transparent structural component.

The transparent structural component with encapsulated microLEDs can be used in various locations of a vehicle including as a transparent roof, a sunroof, a moonroof, side glass, a windshield, a rear window or other locations. In other examples, the transparent structural component with encapsulated microLEDs can be used inside of the vehicle for other purposes, and/or used in non-vehicle applications.

Figure 1:
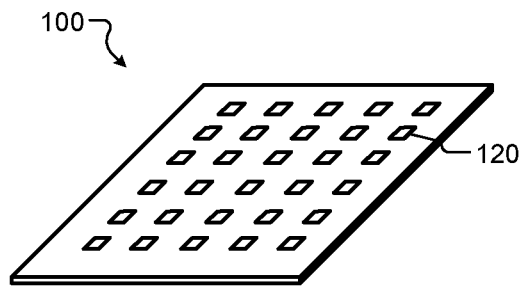
FIGS. 1 and 2 are perspective views of examples of a transparent structural component including encapsulated LEDs or microLEDs (prior to encapsulation) according to the present disclosure.

Referring now to FIGS. 1 to 4B, examples of the transparent structural component with encapsulated microLEDs are shown prior to encapsulation. In FIG. 1, a transparent structural component 100 is shown prior to encapsulation and initially includes a transparent layer 110 and a plurality of microLEDs 120. Examples of methods for fabricating microLEDs on a transparent layer (such as a polymer layer) are shown in Lee et al., "Improved Light Output Power Chemically Transferred InGaN/GaN Light-Emitting Diodes for Flexible Optoelectronic Applications", Journal of Nanomaterials 2015 (5) pages 1-6, which is incorporated herein by reference in its entirety.

Figure 2:
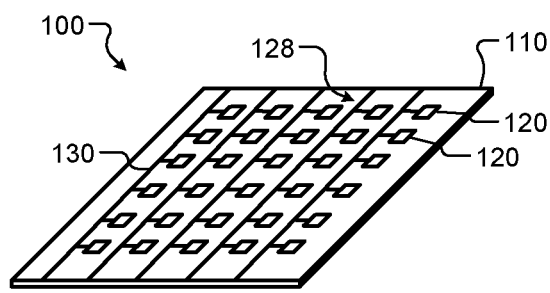

In FIG. 2, interconnects 128 such as conductive traces 130, conductive ink or conductive fibers are added to the transparent layer 110 to allow power and ground to be supplied to each of the plurality of microLEDs 120 (either individually and/or as groups). In some examples, the interconnects 130 include copper traces that are patterned on the transparent layer 110, conductive ink that is printed on the transparent layer, and/or conductive fibers (described further below).

Figure 3A:
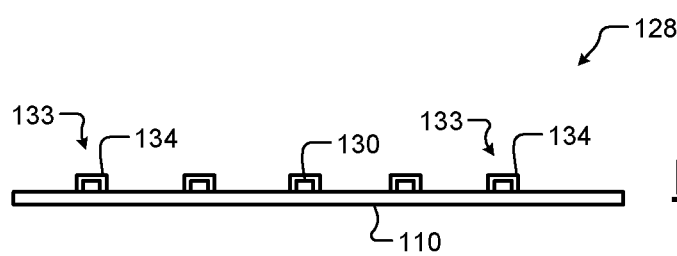
FIGS. 3A and 3B are side cross-sectional views of examples of interconnects for the encapsulated LEDs or microLEDs according to the present disclosure.
Figure 3B:
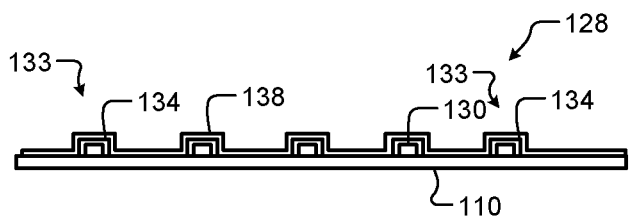
Figure 4A:
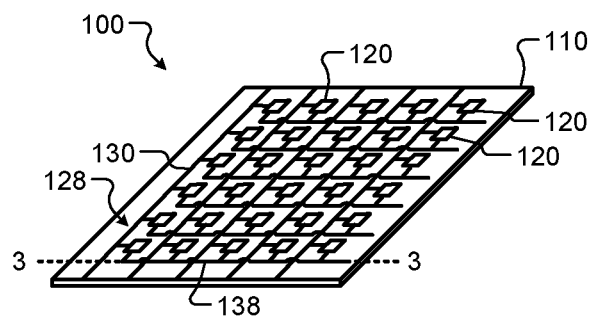
FIGS. 4A and 4B are perspective views of examples of the transparent structural component including encapsulated LEDs or microLEDs (prior to encapsulation) according to the present disclosure.

In FIGS. 3A and 3B, a side cross-sectional view taken along line 3-3 in FIG. 4A is shown. In some examples, the conductive traces 130 are printed on the transparent layer 110 using conductive ink. In some examples, insulating portions 134 are printed over selected locations 133 of the conductive traces 130 using a dielectric ink. After printing the dielectric ink over the selected portions 133 as needed, the second conductive traces 138 (such as conductive ink traces) are printed over the insulating portions 134 (and other locations) to provide connections that traverse the conductive traces 130 without causing a short. In some examples, the conductive and nonconductive ink is printed using an inkjet printer with a piezoelectric printhead, although other methods of applying the conductive ink can be used. In some examples, an additional layer of dielectric ink is printed over the second conductive traces 138 for insulation.

Figure 4B:
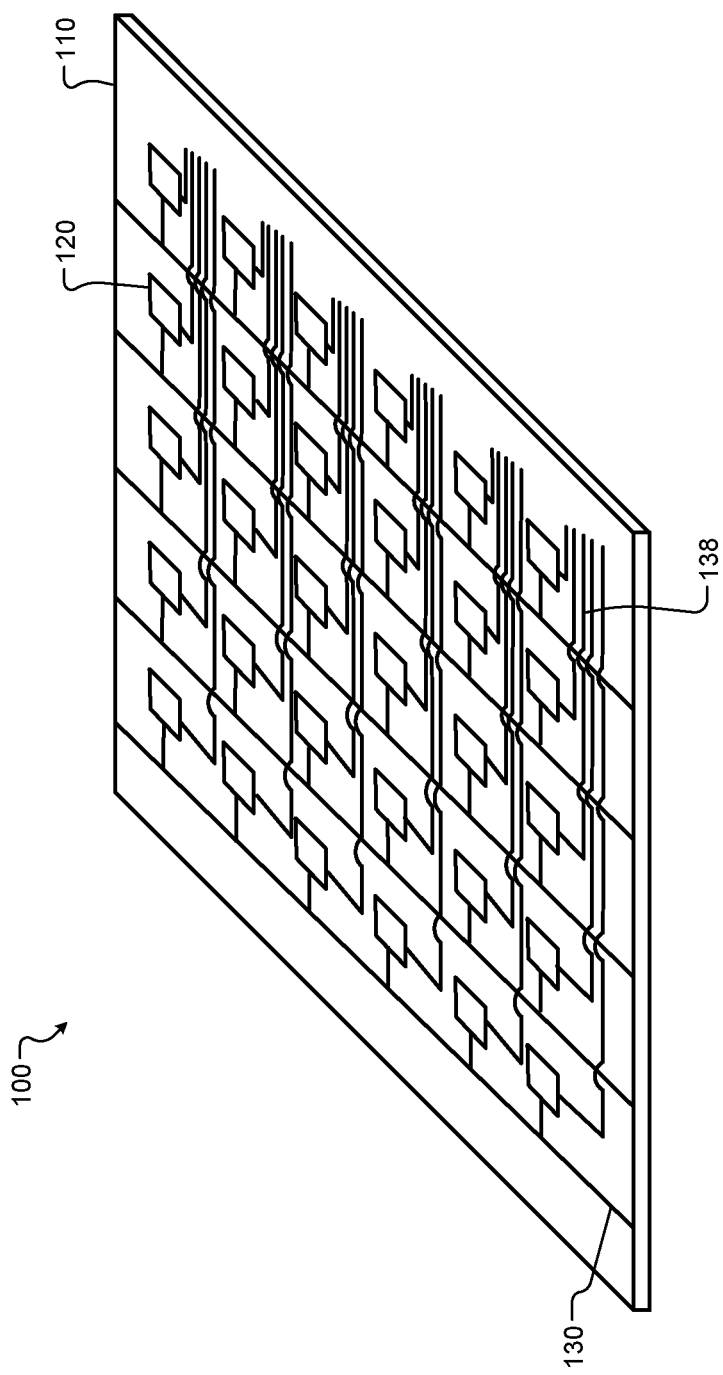

In FIGS. 4A and 4B, the plurality of microLEDs 120 are connected using first and second conductive traces 130 and 138 to provide power and ground, respectively. Isolation can be provided between the first and second conductive traces 130 and 138 as shown in FIGS. 3A and 3B and/or using other methods. In the arrangement shown in FIG. 4A, each row of the plurality of microLEDs 120 can be turned on individually while in FIG. 4B each of the plurality of microLEDs 120 can be turned on individually. In some examples, some of the plurality of microLEDs 120 may be connected together to form a group or sub-display and these microLEDs are turned on and off together at the same time, which reduces the number of interconnects and control signals that are required.

Figure 5A:
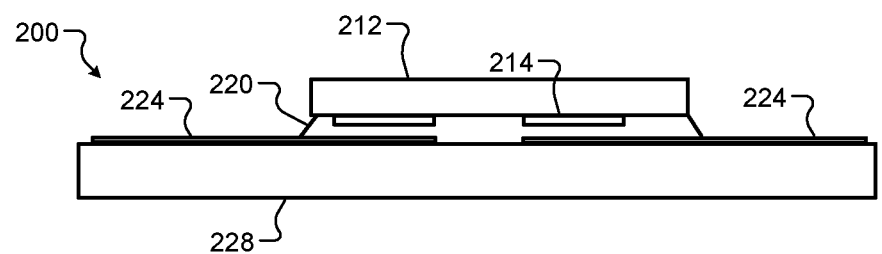
FIG. 5A is a side cross-sectional view illustrating an example of an LED or microLED attached to a transparent layer (prior to encapsulation) according to the present disclosure.
Figure 5B:
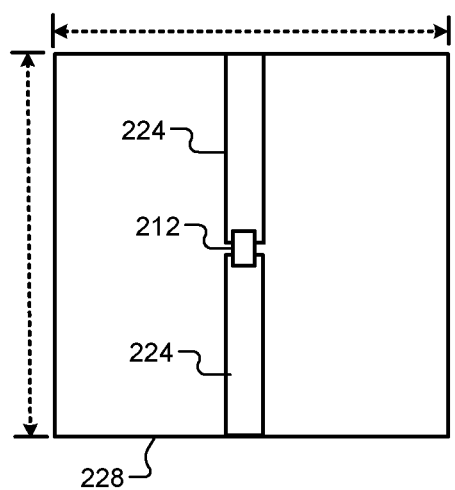
FIG. 5B is a plan view illustrating an example of an LED or microLED attached to a transparent layer (prior to encapsulation) according to the present disclosure.

In FIGS. 5A and 5B, copper can be used for the conductive traces. In some examples, the copper traces are patterned and deposited on the transparent layer 110 during fabrication of the transparent layer with the encapsulated microLEDs. A transparent structural component 200 (shown prior to encapsulation) includes a plurality of microLEDs 212 with pads 214 arranged on one side thereof. The pads 214 of the plurality of microLEDs 212 are connected by conductive adhesive 220 (or conductive paste) to copper traces 224 formed on a facing surface of a transparent layer 228. In some examples, the copper traces 224 are attached to (or patterned and deposited using lithography) on the transparent layer 228. Then, the conductive adhesive 220 is applied in selected locations where microLEDs 212 will be bonded. The microLEDs 212 are picked and placed onto the conductive adhesive 220 and the conductive adhesive 220 is cured. In FIG. 5B, an example of a layout and spacing of one of the plurality of microLEDs 212 is shown. After interconnection is performed, structural fibers are laid over the transparent layer and encapsulation is performed.

Figure 6A:
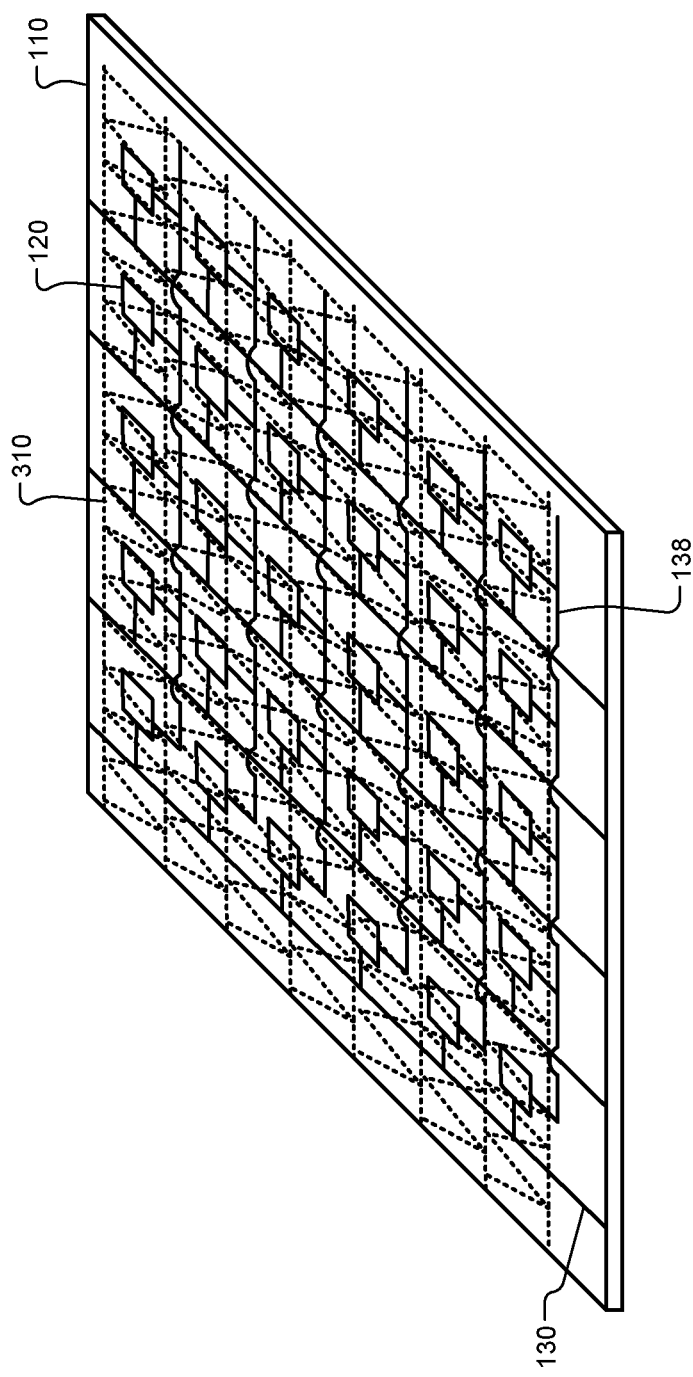
FIGS. 6A and 6B are perspective views illustrating examples of structural fibers laid over the plurality of LEDs or microLEDs on the transparent layer (prior to encapsulation) according to the present disclosure.
Figure 6B:
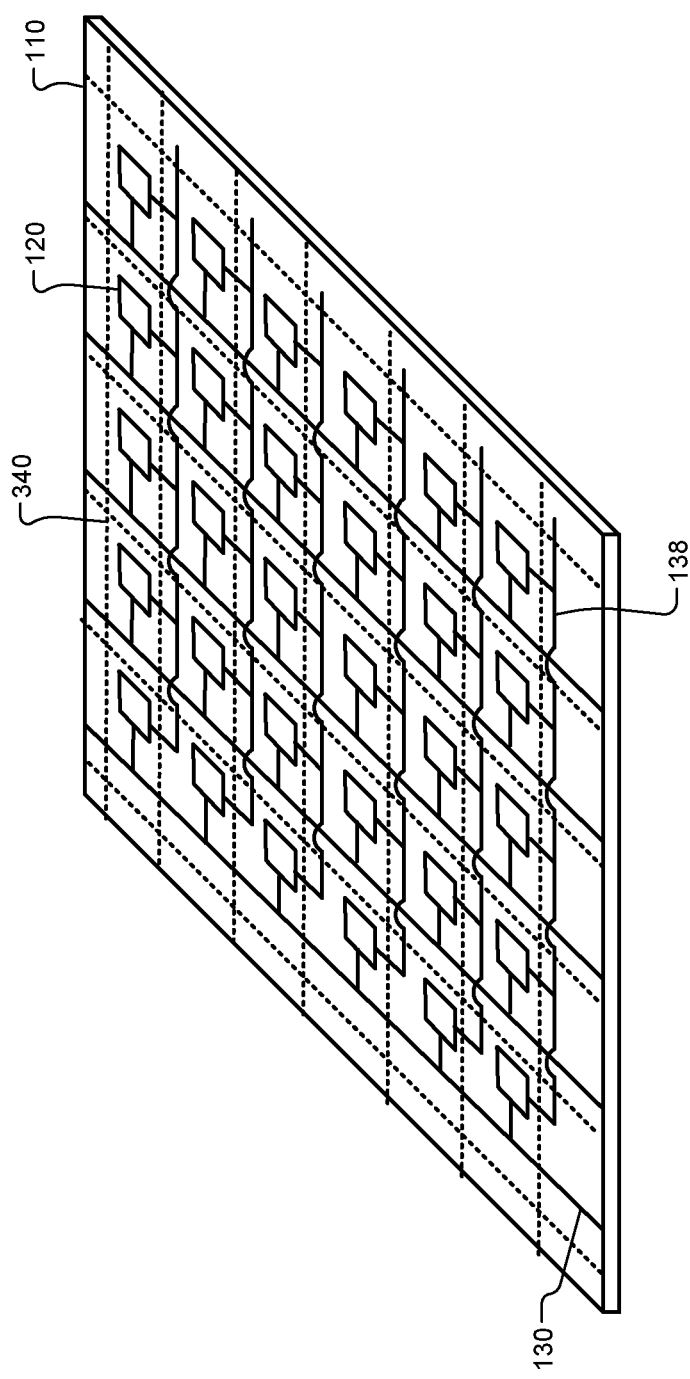

In FIGS. 6A and 6B, structural fibers 310, 340 are laid over the transparent layer 110 including the plurality of microLEDs 120. In some examples, the structural fibers 310, 340 are randomly laid over the transparent layer 110. In other examples, the structural fibers 310, 340 are laid in predetermined patterns. In some examples, the structural fibers 310, 340 are stitched or woven together or randomly placed. While the structural fibers 310, 340 are shown in a particular pattern, other patterns can be used. In some examples, the structural fibers 310, 340 can be a single fiber type in a dry state or the structural fibers can include a plurality of different types of fibers that are co-mingled in the dry state or a single fiber type in a partially cured resin (fiber reinforced pre-impregnated layer) or a single fiber type in a consolidated thermoplastic resin (thermoplastic pre-impregnated layer). The structural fibers 310, 340 may be stitched and laid and/or placed on the transparent layer 110. In some examples, the structural fibers 310, 340 are optionally consolidated by force and/or heat during encapsulation.

Figure 7:
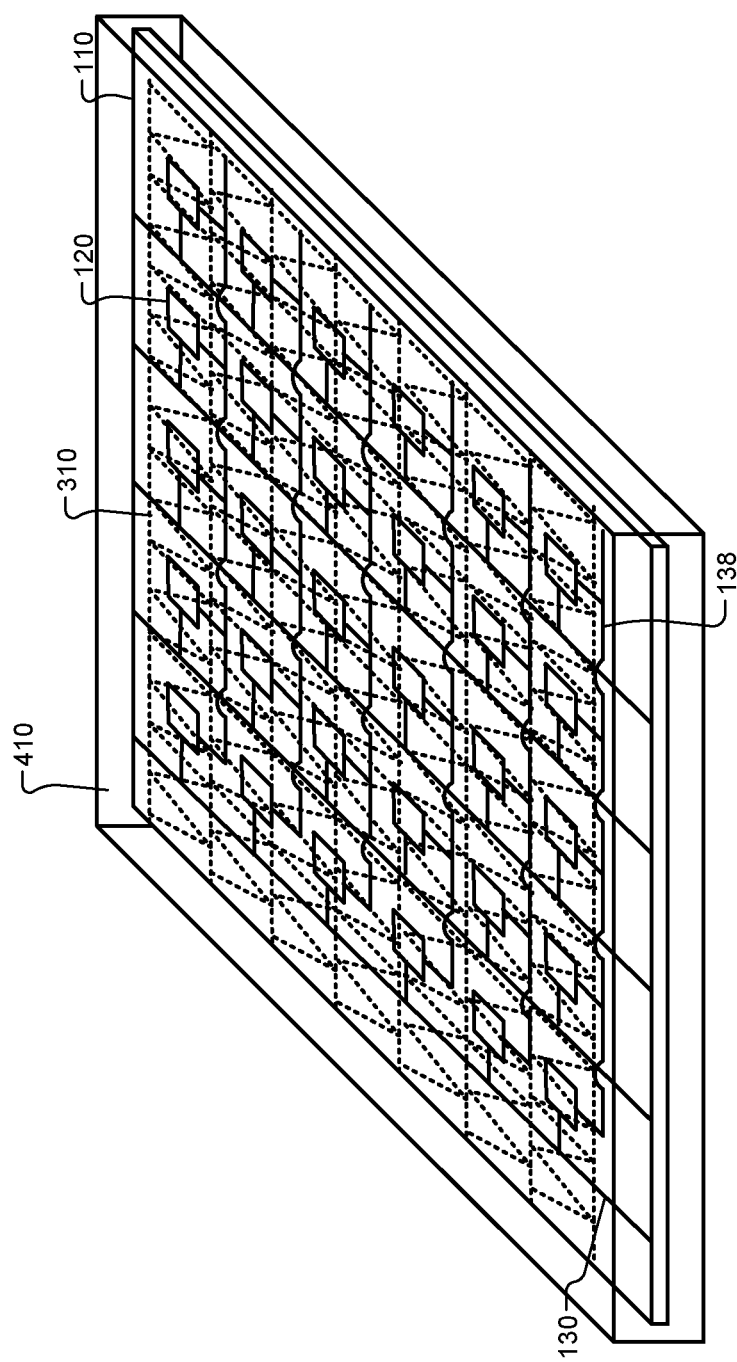
FIG. 7 illustrates an example of structural fibers arranged adjacent to the transparent layer and encapsulated in a transparent material according to the present disclosure.

In FIG. 7, after the structural fibers 310, 340 are laid over the transparent layer 110 including the plurality of microLEDs, an encapsulation or over molding step is performed to encapsulate the transparent layer, the microLEDs, the interconnects and the fibers in a transparent material 410. In some examples, the transparent layer, the microLEDs, the interconnects, and the structural fibers are placed into a tool and the molding material is injected or the molding material is injected and compressed in a two-step process. In some examples, the structural fibers are arranged on a back surface of the transparent layer (opposite to the side with the interconnects and LEDs).

In some examples, if a dry fiber is stitched, the resin that encapsulates the LED can also be the resin that acts as the matrix material for the composite. If a thermoset pre-impregnated layer (pre-preg) is laid down, the encapsulating resin encapsulates all of the layers while the temperature and pressure will consolidate the prepreg and also cure/mold the encapsulant. If a commingled fiber is used (i.e. carbon fiber commingled with polycarbonate), the commingled fiber that is stitched or placed on top of LED containing structure may be consolidated through temperature and pressure, and then encapsulated. If a thermoplastic prepreg is robotically laid down, the thermoplastic prepreg may be in a fully cured state so that the structure is now 'built-in'. This can then be encapsulated in a final step. All of these options can utilize one or more kinds of structural fiber reinforcements (glass, carbon, basalt, Kevlar, flax, hemp, etc).

Referring now to FIGS. 8-10, examples of the transparent structural component that uses conductive fibers as interconnects are shown. The conductive fibers are used to electrically interconnect at least some of the plurality of microLEDs to power and/or ground. In some examples, the microLEDs are interconnected in groups using conductive traces, pads and/or conductive ink and then the groups are connected to the conductive fibers. In other examples, the conductive fibers are connected to individual microLEDs.

In FIG. 8, a group of microLEDs 614 are arranged on a transparent layer 610. The group of microLEDs 614 are controlled passively (in other words, power and ground are delivered to two or more microLEDs as a group—rather than individual power or ground lines to each). The group of microLEDs 614 includes contact pads 615 on a bottom surface thereof that are connected by conducting paste 622 (or solder, adhesive, or another conductive material) to pads 616, 618 on the transparent layer 610. Fibers 634 are connected to the pads 616, 618.

In some examples, the fibers 634 include a wire conductor 638 surrounded by a plurality of non-conducting fibers 639 that are wound around the wire conductor 638. In other examples, the fibers 634 include non-conductive fibers that are coated with metal. In other examples, the fibers 634 are metal-coated and then additional non-conductive fibers are wound around the metal-coated fibers to provide insulation (and selectively removed during assembly for connections to pads or other electrical components).

In FIG. 9, a similar approach can be used to connect individual microLEDs 650, 652 using contact paste 654 (or solder, adhesive, or another conductive material) to connect pads 656 on a bottom surface of the microLEDs 650, 652 to pads 658 on a transparent layer 670. In this example, the fibers 634 provide connections to each of the microLEDs 650, 652. In FIG. 10, the fibers 634 can be connected to contact paste 678 (or solder, adhesive, or another conductive material), which is connected by a copper wire 680 to contact paste 684 (or solder, adhesive, or another conductive material). The contact paste 684 is connected to a pad of the microLED 650. A similar approach is used for the microLED 652.

In some examples, the fiber may include a conductive wire (such as a copper wire) that is surrounded by carbon fiber threads. In some examples, a plurality of non-conducting fibers are metal-coated to allow electrons flow on a surface of the metal-coated fiber. In some examples, a plurality of fibers are metal-coated and then non-conductive fibers are wound around the metal-coated fibers to provide an outer insulating layer. In still other examples, the fiber is conductive without the metal coating or conductive wire.

In some examples, the conductive fiber includes a copper center wire and non-conducting fiber surrounding the copper center wire. In some examples, carbon fibers are metal-coated and then surrounded by an insulating carrier. In some examples, the metal coating on the fiber is selected from a group consisting of nickel (Ni), silver (Ag), aluminum (Al), Copper (Cu) and/or other metal or alloy. In some examples, the metal coating is applied over each individual fiber or groups of wound fibers. In some examples, ends of the fiber are flame treated during assembly to remove the outer fiber and expose the conductive wire to facilitate soldering or bonding using conductive paste (such as silver paste) and/or conductive adhesive.

Non-coated carbon fiber bundles have a resistance of 3 ohm/cm. In some examples, a nickel-coated carbon fiber bundle including about 1000 fibers has a resistance of 60 milliohms/cm in a longitudinal direction. In some examples, a nickel-coated carbon fiber bundle further includes a center copper wire.

Figure 11:
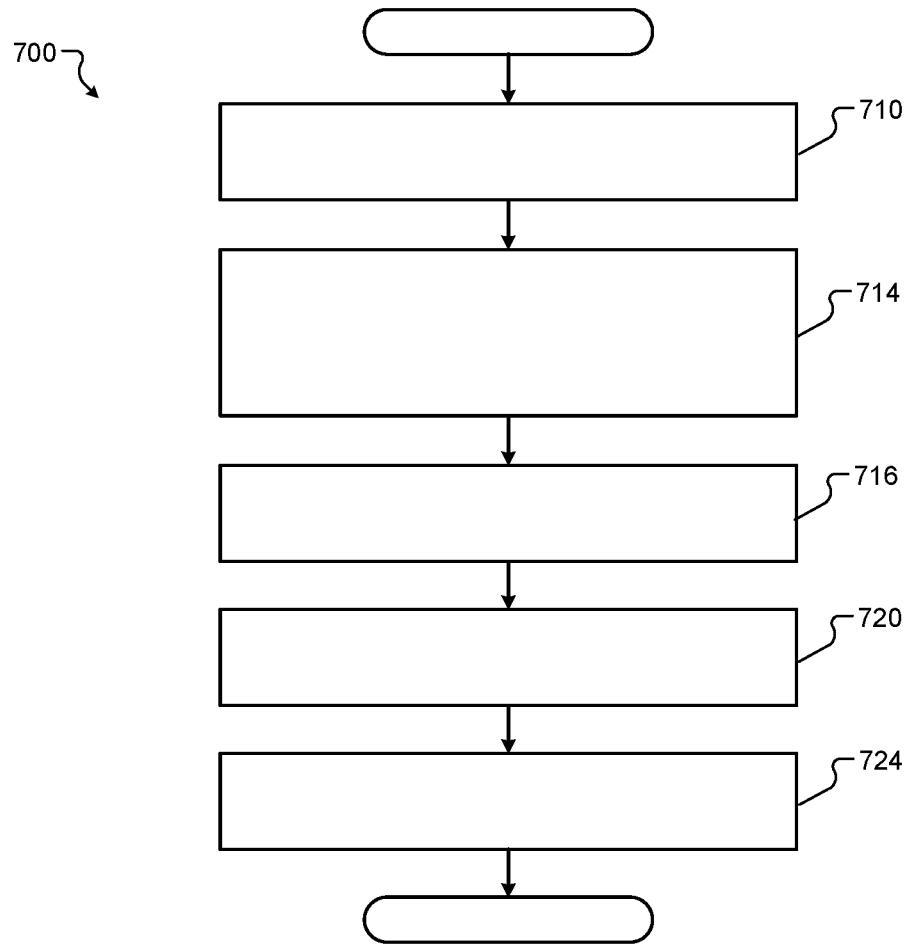
FIG. 11 is an example of a method for manufacturing a transparent structural component with encapsulated LEDs or microLEDs according to the present disclosure.

Referring now to FIG. 11, a method 700 for manufacturing a transparent structural component with embedded microLEDs is shown. At 710, microLEDs are provided in a predetermined pattern on a transparent layer. At 714, interconnections are created between the microLEDs on the transparent layer. The interconnects allow the microLEDs to be connected to and controlled by a power source and/or a controller via copper traces, conductive and/or dielectric ink and/or conducting fibers. At 716, structural fibers are laid onto the polymer film over the plurality of microLEDs. At 720, the transparent film is over molded in a transparent material. At 724, an optional coating is added such as a scratch resistant coating.

In some examples, the transparent layer is selected from the group consisting of: an epoxy, a polyurethane (PUR), a polycarbonate (PC), a polymethyl methacrylate (PMMA), a polyethylene terephthalate (PET), a polyacrylate (acrylic), a polyamide (PA), co-transparent layers thereof, and combinations thereof. In some examples, the bottom transparent layer is made of the same material over molding matrix material to eliminate mismatch caused by different indexes of refraction and image distortion. In some examples, the transparent layer has a first index of refraction and the molding material has a second index of refraction.

In some examples, a difference between the first index of refraction and the second index of refraction is less than 2.5% of the first index of refraction. In some examples, a difference between the first index of refraction and the second index of refraction is less than 1% of the first index of refraction. In some examples, the transparent layer and the molding material are made of the same type of material.

The transparent layer may be a thermoset transparent layer or a thermoplastic transparent layer that is substantially transparent when free of fibers. In certain aspects, the transparent layer may be a thermoset transparent layer selected from the group consisting of: benzoxazine, a bismaleimide (BMI), a cyanate ester, an epoxy, a phenolic (PF), a polyacrylate (acrylic), a polyimide (PI), an unsaturated polyester, a polyurethane (PUR), a vinyl ester, a siloxane, co-transparent layers thereof, and combinations thereof. In certain aspects, the transparent layer may be a thermoplastic transparent layer selected from the group consisting of: polyethylenimine (PEI), polyamide-imide (PAI), polyamide (PA) (e.g., nylon 6, nylon 66, nylon 12, nylon 11, nylon 6-3-T), polyetheretherketone (PEEK), polyetherketone (PEK), polyvinyl chloride (PVC), a polyphenylene sulfide (PPS), a thermoplastic polyurethane (TPU), polypropylene (PP), polycarbonate/acrylonitrile butadiene styrene (PC/ABS), high-density polyethylene (HDPE), polyethylene terephthalate (PET), poly(methyl methacrylate) (PMMA), styrene methyl methacrylate (SMMA), methyl methacrylate acrylonitrile butadiene styrene (MABS), polycarbonate (PC), polyaryletherketone (PAEK), polyetherketoneketone (PEKK), co-transparent layers thereof, and combinations thereof.

In some examples, the plurality of fibers is selected from the group consisting of: glass fibers, carbon fibers, basalt fibers, aramid fibers, polyethylene fibers, polypropylene fibers, natural fibers, or any combination thereof. In one aspect, the plurality of fibers have a shape selected from the group consisting of: cylindrical, flat, or both cylindrical and flat.

Suitable fiber materials may include carbon fibers (e.g., carbon black, carbon nanotubes, talc, fibers derived from polyacrylonitrile and/or pitch precursors), glass fibers (e.g., fiber glass, quartz), basalt fibers, aramid fibers (e.g., KEVLAR®, polyphenylene benzobisoxazole (PBO)), polyethylene fibers (e.g., high-strength ultra-high molecular weight (UHMW) polyethylene), polypropylene fibers (e.g., high-strength polypropylene), natural fibers (e.g., cotton, flax, cellulose, spider silk), and combinations thereof, by way of example.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A transparent structural component including embedded light emitting diodes (LEDs), comprising:
    a transparent layer;
    a plurality of LEDs arranged on the transparent layer;
    a plurality of interconnections to the plurality of LEDs;
    a plurality of structural fibers arranged adjacent to the transparent layer, wherein the plurality of structural fibers are arranged on an opposite side of the transparent layer as the plurality of LEDs or are arranged over the plurality of LEDs; and
    a transparent material encapsulating the transparent layer, the plurality of LEDs, the plurality of interconnections and the plurality of structural fibers, wherein the transparent material entirely encapsulates the transparent layer, the plurality of LEDs, the plurality of interconnections and the plurality of structural fibers.

2. The transparent structural component of claim 1, wherein the plurality of structural fibers are selected from a group consisting of glass fibers, carbon fibers, basalt fibers, aramid fibers, polyethylene fibers, polypropylene fibers, natural fibers, and combinations thereof.

3. The transparent structural component of claim 1, wherein at least one of the transparent layer and the transparent material are selected from a group consisting of polyethylenimine (PEI), polyamide-imide (PAI), polyamide (PA), polyetheretherketone (PEEK), polyetherketone (PEK), a polyphenylene sulfide (PPS), a thermoplastic polyurethane (TPU), polypropylene (PP), polycarbonate/acrylonitrile butadiene styrene (PC/ABS), high-density polyethylene (HDPE), polyethylene terephthalate (PET), poly(methyl methacrylate) (PMMA), polycarbonate (PC), polyaryletherketone (PAEK), polyetherketoneketone (PEKK), co-transparent layers thereof, and combinations thereof.

4. The transparent structural component of claim 1, wherein the plurality of interconnections to the plurality of LEDs are selected from a group consisting of:
copper traces formed on the transparent layer;
first conductive ink traces; and
conductive fibers.

5. The transparent structural component of claim 4, wherein:
the plurality of interconnections to the plurality of LEDs comprise the conductive fibers;
a plurality of portions of the first conductive ink traces are covered by a dielectric ink; and
second conductive ink traces are arranged over the dielectric ink and the first conductive ink traces at the plurality of portions.

6. The transparent structural component of claim 5, wherein the conductive fibers are selected from a group consisting of conductive carbon fibers, metal-coated fibers and non-conductive fibers wound around a conductive wire.

7. The transparent structural component of claim 1, wherein the transparent layer has a first index of refraction and the transparent material is made of a second material having a second index of refraction, and wherein a difference between the first index of refraction and the second index of refraction is less than 2.5% of the first index of refraction.

8. The transparent structural component of claim 7, wherein a difference between the first index of refraction and the second index of refraction is less than 1% of the first index of refraction.

9. The transparent structural component of claim 1, wherein the transparent layer and the transparent material are made of the same type of material.

10. The transparent structural component of claim 1, wherein the plurality of LEDs comprise microLEDs.

11. A method for making a transparent structural component including embedded light emitting diodes (LEDs), comprising:
providing a transparent layer and a plurality of LEDs arranged on the transparent layer;
providing a plurality of interconnections to the plurality of LEDs;
arranging a plurality of structural fibers adjacent to the transparent layer, wherein the plurality of structural fibers are arranged on an opposite side of the transparent layer as the plurality of LEDs or are arranged over the plurality of LEDs; and
encapsulating the transparent layer, the plurality of LEDs, the plurality of interconnections and the plurality of structural fibers in a transparent material, wherein the transparent material entirely encapsulates the transparent layer, the plurality of LEDs, the plurality of interconnections and the plurality of structural fibers.

12. The method for making the transparent structural component of claim 11, further comprising selecting the plurality of structural fibers from a group consisting of glass fibers, carbon fibers, basalt fibers, aramid fibers, polyethylene fibers, polypropylene fibers, natural fibers, and combinations thereof.

13. The method of making the transparent structural component of claim 11, further comprising selecting at least one of the transparent layer and the transparent material from a group consisting of polyethylenimine (PEI), polyamide-imide (PAI), polyamide (PA), polyetheretherketone (PEEK), polyetherketone (PEK), a polyphenylene sulfide (PPS), a thermoplastic polyurethane (TPU), polypropylene (PP), polycarbonate/acrylonitrile butadiene styrene (PC/ABS), high-density polyethylene (HDPE), polyethylene terephthalate (PET), poly(methyl methacrylate) (PMMA), polycarbonate (PC), polyaryletherketone (PAEK), polyetherketoneketone (PEKK), co-transparent layers thereof, and combinations thereof.

14. The method of making the transparent structural component of claim 11, wherein the plurality of interconnections to the plurality of LEDs are selected from a group consisting of:
copper traces formed on the transparent layer;
first conductive ink traces printed on the transparent layer; and
conductive fibers attached to the plurality of LEDs.

15. The method of making the transparent structural component of claim 14, wherein:
the plurality of interconnections to the plurality of LEDs comprise the conductive fibers;
a plurality of portions of the first conductive ink traces are covered by a dielectric ink; and
second conductive ink traces are arranged over the dielectric ink and the first conductive ink traces at the plurality of portions.

16. The method of making the transparent structural component of claim 11, wherein the plurality of interconnections to the plurality of LEDs comprise conductive fibers and further comprising selecting the conductive fibers from a group consisting of conductive carbon fibers, metal-coated fibers and non-conductive fibers wound around a conductive wire.

17. The method of making the transparent structural component of claim 11, wherein the transparent layer has a first index of refraction and the transparent material is made of a second material having a second index of refraction, and wherein a difference between the first index of refraction and the second index of refraction is less than 2.5% of the first index of refraction.

18. The method of making the transparent structural component of claim 17, wherein a difference between the first index of refraction and the second index of refraction is less than 1% of the first index of refraction.

19. The method of making the transparent structural component of claim 11, wherein the transparent layer and the transparent material are made of the same type of material.

20. The method of making the transparent structural component of claim 11, wherein the plurality of LEDs comprise microLEDs.

* * * * *